United States Patent
Chua et al.

(10) Patent No.: US 10,903,176 B2
(45) Date of Patent: Jan. 26, 2021

(54) METHOD OF FORMING A PHOTODIODE

(71) Applicant: Palo Alto Research Center Incorporated, Palo Alto, CA (US)

(72) Inventors: Christopher L. Chua, San Jose, CA (US); JengPing Lu, Fremont, CA (US); Gregory Whiting, Menlo Park, CA (US); Scott J. Limb, Palo Alto, CA (US); Rene A. Lujan, Sunnyvale, CA (US); Qian Wang, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 16/257,304

(22) Filed: Jan. 25, 2019

(65) Prior Publication Data
US 2019/0172800 A1 Jun. 6, 2019

Related U.S. Application Data

(62) Division of application No. 15/220,221, filed on Jul. 26, 2016, now Pat. No. 10,224,297.

(51) Int. Cl.
| | | |
|---|---|---|
| H01L 31/20 | (2006.01) | |
| H01L 23/00 | (2006.01) | |
| H03K 19/17768 | (2020.01) | |
| H01L 23/15 | (2006.01) | |
| H01L 23/34 | (2006.01) | |

(Continued)

(52) U.S. Cl.
CPC ............ *H01L 23/576* (2013.01); *H01L 23/15* (2013.01); *H01L 23/345* (2013.01); *H01L 23/5256* (2013.01); *H01L 23/57* (2013.01); *H01L 23/64* (2013.01); *H01L 31/202* (2013.01); *H03K 19/17768* (2013.01); *H01L 29/74* (2013.01); *H01L 31/022408* (2013.01); *H01L 31/022475* (2013.01)

(58) Field of Classification Search
CPC ..................................................... H01L 31/105
See application file for complete search history.

(56) References Cited

U.S. PATENT DOCUMENTS 2,529,210 A 11/1950 Butler
3,397,278 A 8/1968 Pomerantz
(Continued)

FOREIGN PATENT DOCUMENTS

| DE | 102004015546 | 10/2005 |
|---|---|---|
| JP | 2008216848 A | * 9/2008 |
| WO | 0143228 | 6/2001 |

OTHER PUBLICATIONS

Limb et al., U.S. Appl. No. 15/726,944, filed Oct. 6, 2017.
(Continued)

*Primary Examiner* — Thanh Luu
(74) *Attorney, Agent, or Firm* — Mueting Raasch Group

(57) ABSTRACT

A self-destructing device includes a stressed substrate with a heater thermally coupled to the stressed substrate. The device includes a power source and trigger circuitry comprising a sensor and a switch. The sensor generates a trigger signal when exposed to a trigger stimulus. The switch couples the power source to the heater in response to the trigger signal When energized by the power source, the heater generates heat sufficient to initiate self-destruction of the stressed substrate.

23 Claims, 17 Drawing Sheets

(51) Int. Cl.
*H01L 23/525* (2006.01)
*H01L 23/64* (2006.01)
*H01L 29/74* (2006.01)
*H01L 31/0224* (2006.01)

(56) References Cited

U.S. PATENT DOCUMENTS

| | | |
|---|---|---|
| 3,601,114 A | 8/1971 | Cook |
| 3,666,967 A | 5/1972 | Keister et al. |
| 3,673,667 A | 7/1972 | Lowenstein et al. |
| 3,882,323 A | 5/1975 | Smolker |
| 4,102,664 A | 7/1978 | Dunbaugh, Jr. |
| 4,139,359 A | 2/1979 | Johnson et al. |
| 4,471,895 A | 9/1984 | Lisec, Jr. |
| 4,598,274 A | 7/1986 | Holmes |
| 4,673,453 A | 6/1987 | Georgi |
| 4,739,555 A | 4/1988 | Jurgens |
| 5,374,564 A | 12/1994 | Bruel |
| 5,584,219 A | 12/1996 | Dunn et al. |
| 5,791,056 A | 8/1998 | Messina |
| 6,418,628 B1 | 7/2002 | Steingass |
| 7,002,517 B2 | 2/2006 | Noujeim |
| 7,153,758 B2 | 12/2006 | Hata et al. |
| 7,554,085 B2 | 6/2009 | Lee |
| 7,880,248 B1 | 2/2011 | Pham et al. |
| 7,944,049 B2 | 5/2011 | Fujii |
| 8,130,072 B2 | 3/2012 | De Bruyker et al. |
| 8,740,030 B2 | 6/2014 | Purdy et al. |
| 9,154,138 B2 | 10/2015 | Limb et al. |
| 9,294,098 B2 | 3/2016 | Shah et al. |
| 9,356,603 B2 | 5/2016 | Limb et al. |
| 9,577,047 B2 | 2/2017 | Chua et al. |
| 9,630,870 B2 | 4/2017 | Zhao et al. |
| 9,780,044 B2 | 10/2017 | Limb et al. |
| 9,790,128 B2 | 10/2017 | Garner et al. |
| 10,012,250 B2 | 7/2018 | Limb et al. |
| 10,026,579 B2 | 7/2018 | Whiting et al. |
| 10,026,651 B1 | 7/2018 | Limb et al. |
| 10,308,543 B2 | 6/2019 | Lee |
| 10,717,669 B2 | 7/2020 | Murphy et al. |
| 2002/0052192 A1* | 5/2002 | Yamazaki ............ G06K 9/0004 455/411 |
| 2003/0089755 A1 | 5/2003 | Peers-Smith et al. |
| 2004/0031966 A1 | 2/2004 | Forrest |
| 2004/0222500 A1 | 11/2004 | Aspar et al. |
| 2005/0061032 A1 | 3/2005 | Yoshizawa |
| 2005/0082331 A1 | 4/2005 | Yang |
| 2005/0084679 A1 | 4/2005 | Sglavo et al. |
| 2005/0176573 A1 | 8/2005 | Thoma et al. |
| 2006/0138798 A1 | 6/2006 | Oehrlein |
| 2006/0270190 A1 | 11/2006 | Nastasi et al. |
| 2007/0113886 A1 | 5/2007 | Arao et al. |
| 2008/0029195 A1 | 2/2008 | Lu |
| 2008/0311686 A1 | 12/2008 | Morral et al. |
| 2009/0086170 A1 | 4/2009 | El-Ghoroury et al. |
| 2010/0035038 A1 | 2/2010 | Barefoot et al. |
| 2010/0133641 A1 | 6/2010 | Kim |
| 2010/0225380 A1 | 9/2010 | Hsu et al. |
| 2011/0048756 A1 | 3/2011 | Shi et al. |
| 2011/0089506 A1 | 4/2011 | Hoofman et al. |
| 2011/0183116 A1 | 7/2011 | Hung et al. |
| 2012/0052252 A1 | 3/2012 | Kohli et al. |
| 2012/0135177 A1 | 5/2012 | Comejo et al. |
| 2012/0135195 A1 | 5/2012 | Glaesemann et al. |
| 2012/0196071 A1 | 8/2012 | Comejo et al. |
| 2012/0288676 A1 | 11/2012 | Sondergard et al. |
| 2013/0037308 A1 | 2/2013 | Wang et al. |
| 2013/0082383 A1 | 4/2013 | Aoya |
| 2013/0140649 A1 | 6/2013 | Rogers et al. |
| 2013/0192305 A1 | 8/2013 | Black et al. |
| 2013/0273717 A1 | 10/2013 | Hwang et al. |
| 2014/0042202 A1 | 2/2014 | Lee |
| 2014/0091374 A1 | 4/2014 | Assefa et al. |
| 2014/0103957 A1 | 4/2014 | Fritz et al. |
| 2014/0266946 A1 | 9/2014 | Billy et al. |
| 2014/0300520 A1 | 10/2014 | Nguyen et al. |
| 2014/0323968 A1 | 10/2014 | Rogers et al. |
| 2015/0001733 A1 | 1/2015 | Karhade |
| 2015/0044445 A1 | 2/2015 | Gamer et al. |
| 2015/0076677 A1 | 3/2015 | Ebefors |
| 2015/0089977 A1 | 4/2015 | Li |
| 2015/0102852 A1 | 4/2015 | Limb et al. |
| 2015/0121964 A1 | 5/2015 | Zhao et al. |
| 2015/0229028 A1 | 8/2015 | Billy et al. |
| 2015/0232369 A1 | 8/2015 | Majanovic et al. |
| 2015/0318618 A1 | 11/2015 | Chen et al. |
| 2015/0348940 A1 | 12/2015 | Woychik |
| 2015/0358021 A1 | 12/2015 | Limb et al. |
| 2015/0372389 A1 | 12/2015 | Chen et al. |
| 2016/0122225 A1 | 5/2016 | Wada et al. |
| 2016/0137548 A1 | 5/2016 | Cabral, Jr. et al. |
| 2017/0036942 A1 | 2/2017 | Abramov et al. |
| 2017/0217818 A1 | 8/2017 | Dumenil et al. |
| 2017/0292546 A1 | 10/2017 | Limb et al. |
| 2018/0005963 A1 | 1/2018 | Limb et al. |
| 2018/0033577 A1 | 2/2018 | Whiting et al. |
| 2018/0033742 A1 | 2/2018 | Chua et al. |
| 2018/0114761 A1 | 4/2018 | Chua et al. |
| 2018/0306218 A1 | 10/2018 | Limb et al. |
| 2018/0330907 A1 | 11/2018 | Whiting et al. |
| 2019/0106069 A1 | 4/2019 | Wheeler et al. |

OTHER PUBLICATIONS

Murphy et al., U.S. Appl. No. 15/981,328, filed May 16, 2018.
Limb et al., U.S. Appl. No. 16/025,573, filed Jul. 2, 2018.
File History for U.S. Appl. No. 14/796,440, 183 pages.
File History for U.S. Appl. No. 15/092,313, 195 pages.
File History for U.S. Appl. No. 15/220,164, 192 pages.
File History for U.S. Appl. No. 15/220,221, 198 pages.
File History for U.S. Appl. No. 15/629,506, 121 pages.
File History for U.S. Appl. No. 15/689,566, 188 pages.
File History for U.S. Appl. No. 15/726,944, 130 pages.
File History for U.S. Appl. No. 16/025,573, 153 pages.
File History for U.S. Appl. No. 16/033,783, 105 pages.
File History for U.S. Appl. No. 15/229,385.
File History for U.S. Appl. No. 16/433,603.
File History for U.S. Appl. No. 15/981,328.
File History for U.S. Appl. No. 16/273,397.
File History for U.S. Appl. No. 15/299,385.
Office Action from U.S. Appl. No. 16/204,996 dated Sep. 3, 2020, 18 pages.
File History for U.S. Appl. No. 16/207,709.

* cited by examiner

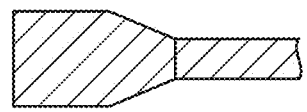
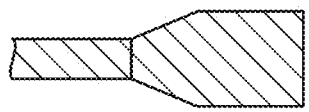
FIG. 11A   FIG. 11B
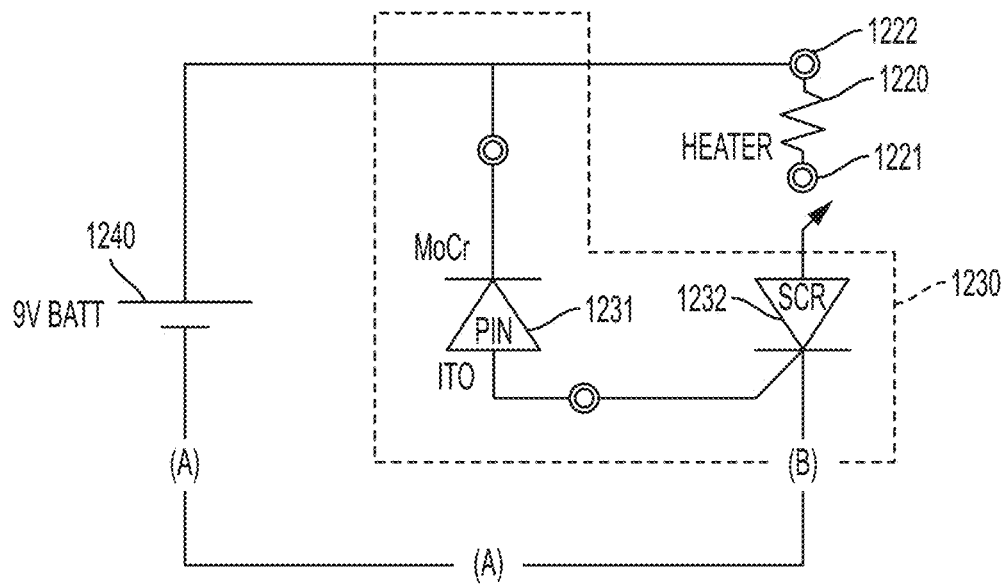
FIG. 12A

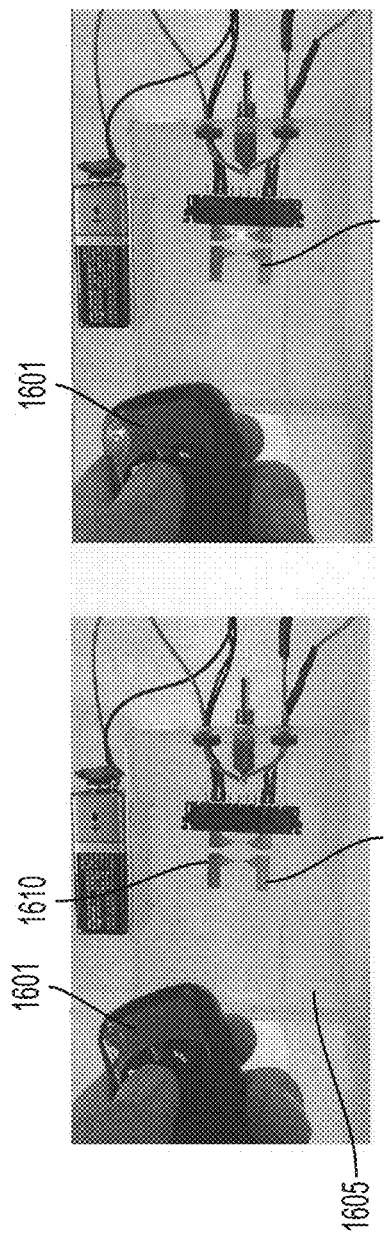
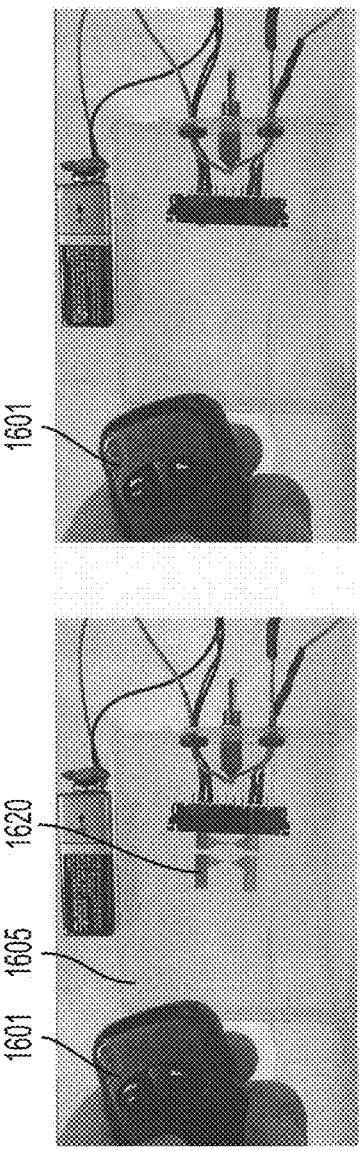
FIG. 16A  FIG. 16B  FIG. 16C  FIG. 16D

METHOD OF FORMING A PHOTODIODE

RELATED APPLICATIONS

This application is a divisional of U.S. Ser. No. 15/220,221, filed Jul. 26, 2016, which is incorporated herein by reference in its entirety.

STATEMENT REGARDING FEDERALLY SPONSORED RESEARCH AND DEVELOPMENT

This invention is based upon work supported by DARPA under Contract No. HR0011-14-C-0013 DARPA-MTO-VAPR-DUST. The Government has certain rights to this invention.

TECHNICAL FIELD

This disclosure relates generally to devices comprising self-destructing substrates and to related methods and systems.

BACKGROUND

Electronic systems capable of physically self-destructing in a controlled, triggerable manner are useful in a variety of applications, such as maintaining security and supply chain integrity.

BRIEF SUMMARY

Some embodiments are directed to a self-destructing device that includes a stressed substrate with a heater thermally coupled to the stressed substrate. The device includes a power source and trigger circuitry. The trigger circuitry comprises a sensor and a switch. The sensor is configured to generate a trigger signal when exposed to a trigger stimulus. The switch is configured to couple the power source to the heater when activated by the trigger signal which in turn causes the heater to generate heat sufficient to initiate self-destruction of the stressed substrate.

According to some embodiments, a method includes generating a trigger signal in response to exposure to a trigger stimulus. A power source is coupled to a heater in response to the trigger signal. A stressed substrate is heated after the power source is coupled to the heater, damaging the stressed substrate sufficiently to initiate self-destruction of the stressed substrate.

Some embodiments are directed to a method of making a photodiode. A first electrode layer is deposited over a substrate. The first doped layer of an active region is deposited over the first electrode layer. An intrinsic layer is deposited over the first doped layer. The second doped layer of the active region is deposited over the intrinsic layer. The second electrode layer is deposited over the second doped layer. And the first electrode layer, the first doped layer, the intrinsic layer, the second doped layer, and the second electrode layer are patterned to form the photodiode in not more than two mask steps.

BRIEF DESCRIPTION OF DRAWINGS

FIGS. 11A and 11B diagrammatically depict top views that illustrate the process of making the photodetector;

FIG. 12A provides a circuit schematic for a self destructing device according to embodiments disclosed herein;

FIGS. 16A through 16D are a sequence of time lapse photographs that show triggered self destruction of a substrate triggered by an RF signal.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

Embodiments disclosed herein relate to electronic devices capable of self destructing by fracturing into small pieces in a controlled, triggerable manner. Devices and methods disclosed herein are useful in a variety of applications such as government security and supply chain integrity.

Figure 1A:
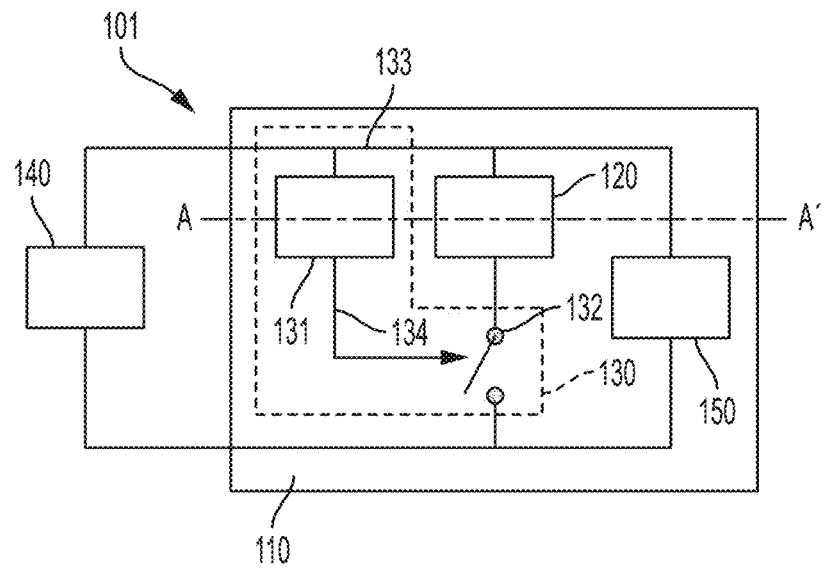
FIGS. 1A, 1B, and 1C show three versions of a self-destructing device in accordance with some embodiments.
Figure 1B:
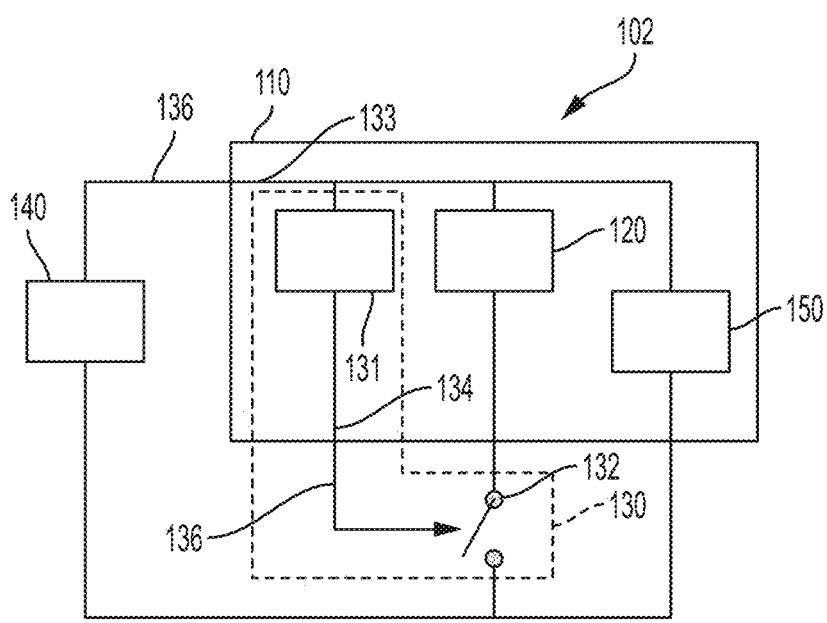
Figure 1C:
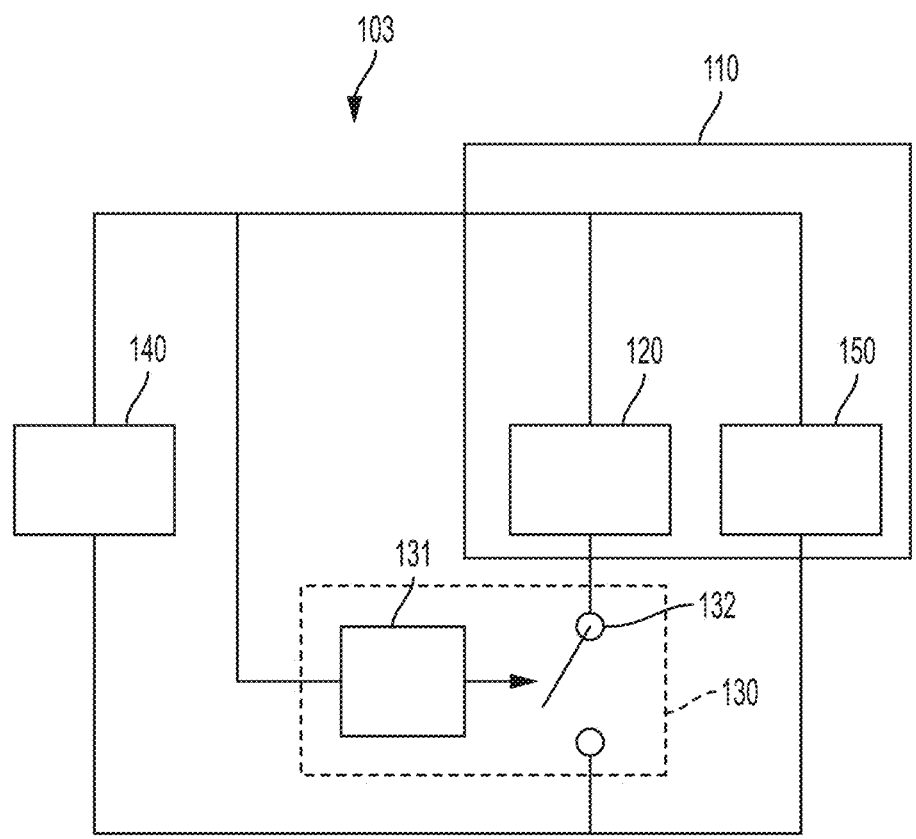

FIGS. 1A, 1B, and 1C show three versions of a self-destructing device 101, 102, 103 configured to self-destruct in response to a trigger stimulus. Self destructing device 101, 102, 103 includes a stressed substrate 110 with a resistive heater 120. The heater 120 is thermally coupled to the stressed substrate 110. In some embodiments, the heater is a resistive conductive film that is energized by flowing electrical current. In other embodiments, the heater is energized by radio-frequency-coupled microwave. In yet another embodiment, the heater is an optical absorber energized by an intense laser beam. In the resistive conductive film embodiment, the heater can be a thin film fuse that breaks when the temperature reaches a sufficiently high value.

Trigger circuitry 130 is configured to cause the heater 120 to be coupled to a power source 140 in response to exposure to a trigger stimulus. The trigger circuitry 130 comprises a sensor 131 and a switch 132. The sensor 131 generates a trigger signal when exposed to the trigger stimulus. After activation by the trigger signal, the switch 132 electrically couples the power source 140 to the heater 120. When energized by the power source 140, the heater 120 generates heat sufficient to initiate self-destruction of the stressed substrate 110. The stressed substrate 110 is engineered to self-destruct by fracturing into many pieces. In some embodiments, the fracture dynamics are designed so that the substrate 110 self destructs by powderizing, where the fractured pieces are small particles such that most particles have length, width, and height dimensions of less than about 900 µm, less than about 500 µm, or even less than about 100 µm.

In one version of the device 101 shown in FIG. 1A, the sensor 131 and switch 132 are located on the stressed substrate 110. In another version of the device 102, shown in FIG. 1B, the switch 132 is not located on the stressed substrate 110. In yet another version of the device 103 shown in FIG. 1C, neither the sensor 131 nor switch 132 is located on the stressed substrate 110. Optionally, in any version of the self-destructing device 101, 102, 103, one or more components 150, e.g., electronic components, may be located on the stressed substrate 110 such that when the stressed substrate 110 self-destructs, the components 150 are also destroyed. In some implementations, the one or more components 150 may comprise an integrated circuit that generates or stores a cryptographic key. When the integrated circuit is destroyed it renders a processor or other system components inaccessible or non-functional.

The process used in preparing the stressed substrate 110, e.g., chemical tempering, imparts a large stress gradient within the thickness of the support substrate 110. This stored mechanical energy is abruptly released when a localized area near the heater is heated and damaged. The resulting shock wave causes the substrate 110 to fracture.

Figure 1D:
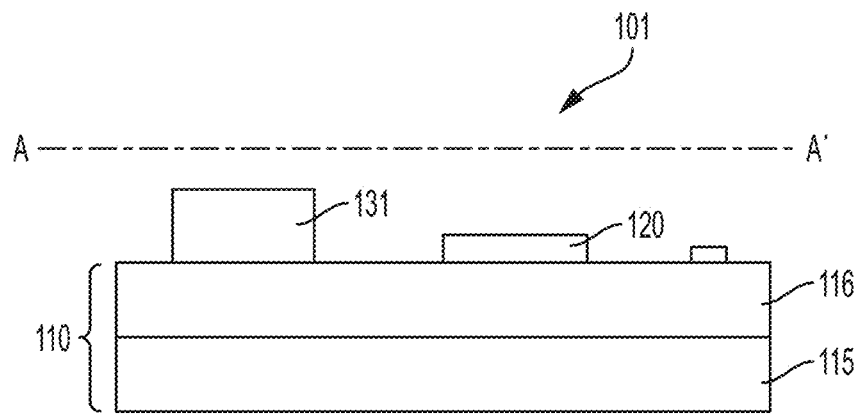
FIG. 1D shows a cross sectional view of a device comprising a stress engineered substrate in accordance with some embodiments.

As shown in the cross sectional view of FIG. 1D which is taken through line A-A' of FIG. 1A, the stressed substrate 110 may be a wafer-like structure including at least one tensile stress layer 115 having a residual tensile stress and at least one compressive stress layer 116 having a residual compressive stress. Tensile stress layer 115 and compressive stress layer 116 (collectively referred to herein as "stress-engineered layers") can be operably integrally connected together such that residual tensile and compressive stresses are self-equilibrating and produce a stress gradient. As set forth in additional detail below, the stress-engineered layers 116 and 115 may be fabricated either by post-treating a substrate material using strategies similar to glass tempering (e.g., by way of heat or chemical treatment), or by depositing the substrate layers using, for example chemical, vapor deposition techniques in which the deposition parameters (i.e., temperature, pressure, chemistry) are varied such that the layers collectively contain a significant inbuilt stress gradient. Note that the arrangement of stress-engineered layers 116 and 115 indicated in FIG. 1D is not intended to be limiting in that one or more stressed and/or non-stressed substrate layers may be disposed on and/or between the two stress-engineered layers.

Figure 2:
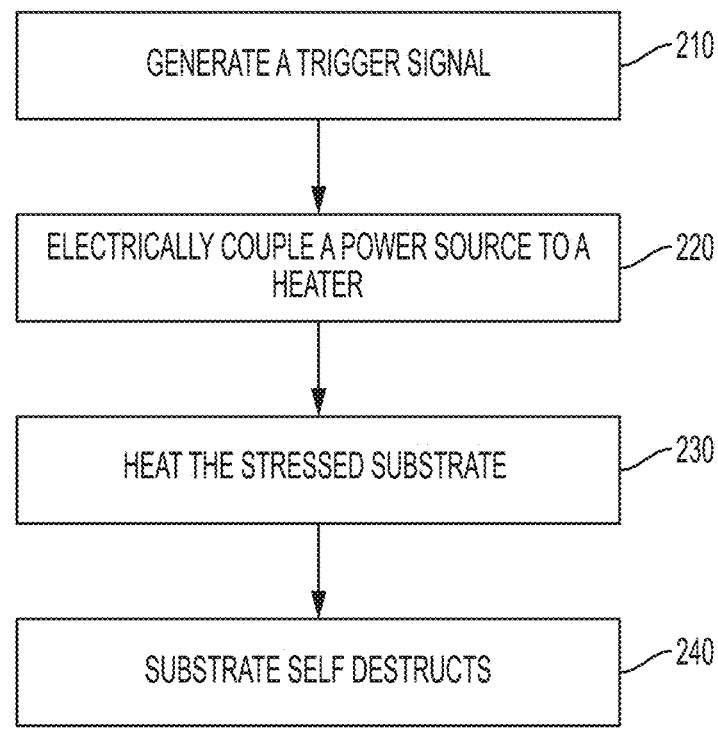
FIG. 2 is a flow diagram illustrating a method of using the self destructing device shown in FIGS. 1A and 1B in accordance with some embodiments.

FIG. 2 is a flow diagram illustrating a method of using the self-destructing device 101, 102, 103 shown in FIGS. 1A through 1D. A trigger signal is generated 210 by the sensor in response to exposure of the sensor to the trigger stimulus. The trigger signal is a control signal that activates the switch to couple 220 the power source to the heater. The heater heats 230 the stressed substrate in a localized area near the heater. The heated area is damaged, which then initiates a rapid release of stored mechanical energy via substrate fracture 240. In some embodiments, a subsequent cooling after the heating stage initiates propagating fractures in the stressed substrate that causes the stressed substrate to self destruct by breaking apart into many pieces.

Various methods may be used to generate the stressed substrate 110. One example approach involves thin film sputter deposition. In thin film sputter deposition, generally two distinct regimes can be identified leading to very different film morphology and characteristics, and result in either compressive or tensile stress. Metals are often used because of functionality (e.g., electrical properties), their structural qualities (e.g., ductility), and the fact that a conductive sputter target allows for a simple, high yield, glow discharge DC magnetron sputtering process. However, stress-engineered metal oxides and glasses (silicon oxides) can be sputtered as well; these insulating or semiconducting films can be sputter deposited by either radiofrequency (RF) sputtering or by reactive sputtering in a mixed inert/reactive gas plasma (e.g. argon/oxygen).

To achieve reliable powderization of the stressed substrate yielding small fragmentation particles, a method for generating stressed support substrates involves adapting stress-engineered thin film fabrication techniques with ion-exchange tempering to create stress profiles in glass (SiO2) substrates, e.g., glass (SiO2) substrates.

Figure 3A:
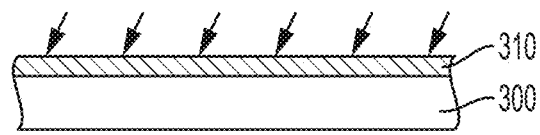
FIGS. 3A to 3E illustrate a first methodology in which a stressed engineered substrate is fabricated in accordance with some embodiments.
Figure 3B:
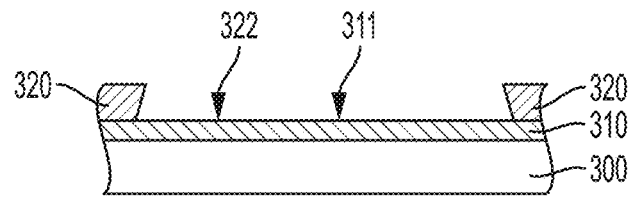
Figure 3C:
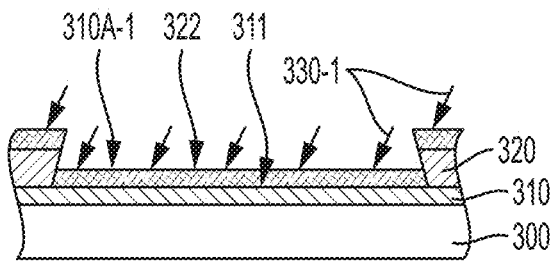
Figure 3D:
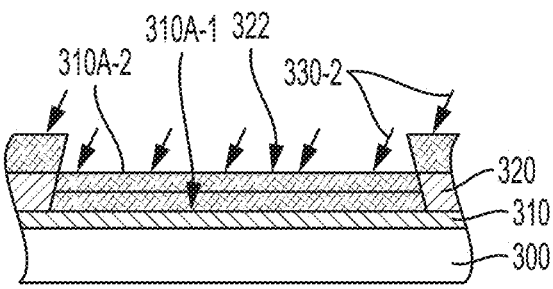
Figure 3E:

FIGS. 3A to 3E illustrate a first methodology in which a stressed support substrate 310A is built up by patterned $SiO_2$ stressed support substrates generated entirely using plasma vapor deposition (PVD) techniques. This method provides a high degree of control over the specific stress profile generated in the stressed support substrate and provides for continuous control over glass formulation and morphology through the thickness dimension of the stressed support substrate. A wafer 300 (e.g., silicon or other material) is coated with a release layer 310, most likely a metal. In FIG. 3B, a thick liftoff mask 320 is then patterned on release layer 310 such that mask 320 defines an opening 322. Note that wafer 300, release layer 310, and mask 320 form a sacrificial structure. Referring to FIGS. 3C and 3D, PVD processing is then used to create the stress engineered layers 310A-1 and 310A-2 in opening 322, placing stresses in the deposited substrate material 330-1 and 330-2, for example, by altering the process parameters (e.g., using different temperatures T1 and T2 and/or pressures P1 and P2). Finally, as indicated in FIG. 3E, the mask is then lifted off, and stressed substrate 310A is singulated (removed) from the remaining sacrificial structure by under-etching the release layer.

Figure 4A:
FIGS. 4A to 4E illustrate a second methodology in which a stressed engineered substrate is fabricated in accordance with some embodiments.
Figure 4B:
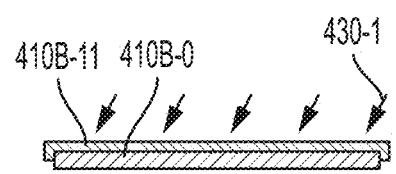
Figure 4C:
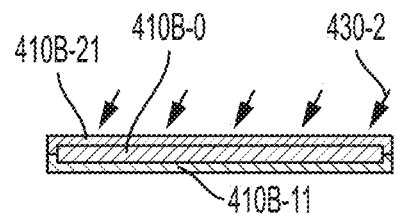
Figure 4D:
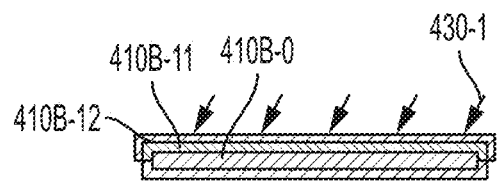
Figure 4E:
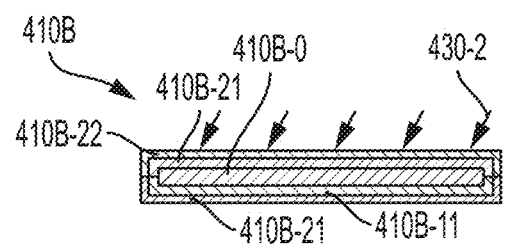

FIGS. 4A to 4E illustrate a second methodology in which a stressed support substrate 410B is built up by patterned $SiO_2$ on a thin glass core using PVD techniques. This methodology provides a high degree of control over the specific stress profile generated in the stressed support substrate. Referring to FIG. 4A, the process begins using a substantially unstressed glass core substrate 410B-0 having a thickness T0 in the range of 25 µm and 100 µm. Suitable glass core substrates are currently produced by Schott North America, Inc. of Elmsford, N.Y., USA). Referring to FIGS. 4B to 4E, $SiO_2$ is then deposited on alternating sides of core substrate 410B-0 via PVD using methods similar to those described above. Specifically, FIG. 4B shows the deposition of material 430-1 in a manner that forms stress-engineered layer 410B-11 on core substrate 410B-0. FIG. 4C shows the deposition of material 430-2 in a manner that forms stress-engineered layer 410B-21 on an opposite side of core substrate 410B-0. FIG. 4C shows the subsequent deposition of material 430-1 in a manner that forms stress-engineered layer 410B-12 on core layer 410B-11, and FIG. 4E shows the deposition of material 430-2 in a manner that forms stress-engineered layer 410B-22 layer 410B-21. FIG. 4E shows completed stressed support substrate 410B including core substrate (central, substantially unstressed layer) 410B-0 with stress-engineered layers 410B-11, 410B-12, 410B-21 and 410B-22 formed thereon.

Figure 5A:
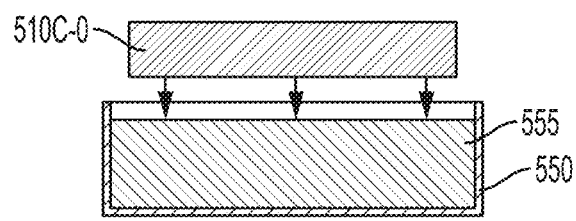
FIGS. 5A to 5E illustrate a third methodology in which a stressed engineered substrate is fabricated in accordance with some embodiments.
Figure 5B:
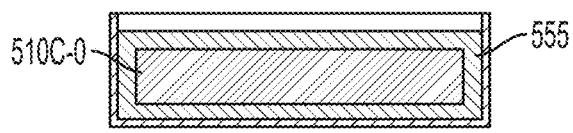
Figure 5C:
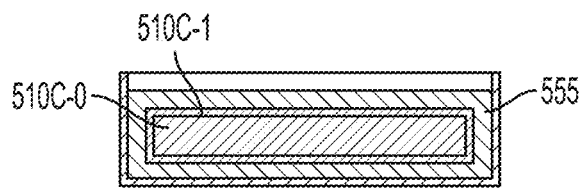
Figure 5D:
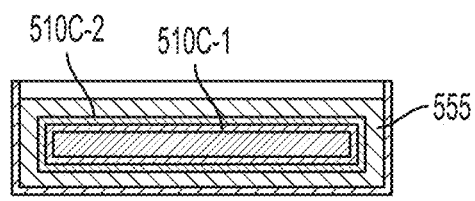
Figure 5E:
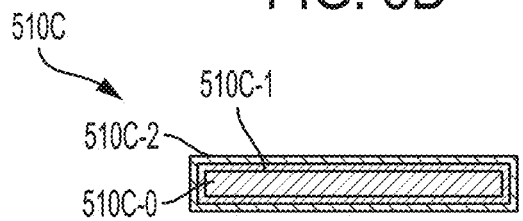

FIGS. 5A to 5E illustrate a third methodology in which a stressed substrate 510C is produced by subjecting a core substrate to one of an ion-exchange tempering treatment, a chemical treatment and a thermal treatment. Specifically, FIGS. 5A to 5E illustrate an exemplary ion-exchange tempering treatment during which various stress profiles are introduced in a core substrate via molten-salt ion exchange. FIG. 5A shows a core substrate 510C-0 over a vat 550 containing a molten-salt solution 555. FIG. 5B shows core substrate 510C-0 immediately after submersion in molten-salt solution 2555, FIG. 5C shows core substrate 510C-0 after a first time period of submersion in molten-salt solution 555 in which a first stress-engineered layer 510C-1 is formed, and FIG. 5D shows the structure after a second time period of submersion in molten-salt solution 555 in which a second stress-engineered layer 510C-2 is formed on first stress-engineered layer 510C-1. FIG. 5E shows completed stressed support substrate 500C including central core substrate 510C-0 and stress-engineered layers 510C-1 and 510C-2.

According to a fourth methodology, a hybrid of the above second and third methods is employed in which diced, thin glass core substrates are ion-exchange tempered, and then multiple layers of SiO2 are deposited on the tempered substrates to further increase the induced stresses.

Referring again to FIGS. 1A through 1D in various embodiments, the sensor 131 may be configured to sense to a variety of trigger stimuli, such as electromagnetic radiation (e.g., radio frequency (RF) radiation, infrared (IR radiation), visible light, ultraviolet (UV) radiation, x-ray radiation, etc.), vibration, a chemical, vapor, gas, sound, temperature, time, moisture, an environmental condition, etc. For embodiments in which the trigger stimulus is visible light, the sensor may be configured to generate the trigger signal in response to exposure to broadband light, such as sunlight or room light, or narrow band light, such as green, red, or blue visible light. For example, the green, red or blue light may be produced by a laser.

In some embodiments, the sensor 131 is configured to detect a tampering event. For example, the tampering event can be detected when the device is exposed to a chemical used for removal of a package cover, the device is vibrated above a threshold vibration, and/or snooping with x-rays that occurs.

In some embodiments, the sensor 131 senses time from a clock. When a timer goes off, an electrical current or voltage trigger signal is generated to trigger the switch.

Figure 6B:
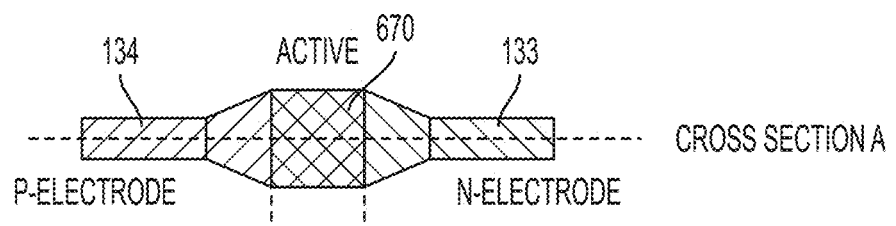
FIG. 6A is a cross sectional view and FIG. 6B is a top view of a p-i-n photodiode used as the sensor of the self destructing device shown in FIGS. 1A and 1B in accordance with some embodiments.
Figure 6A:
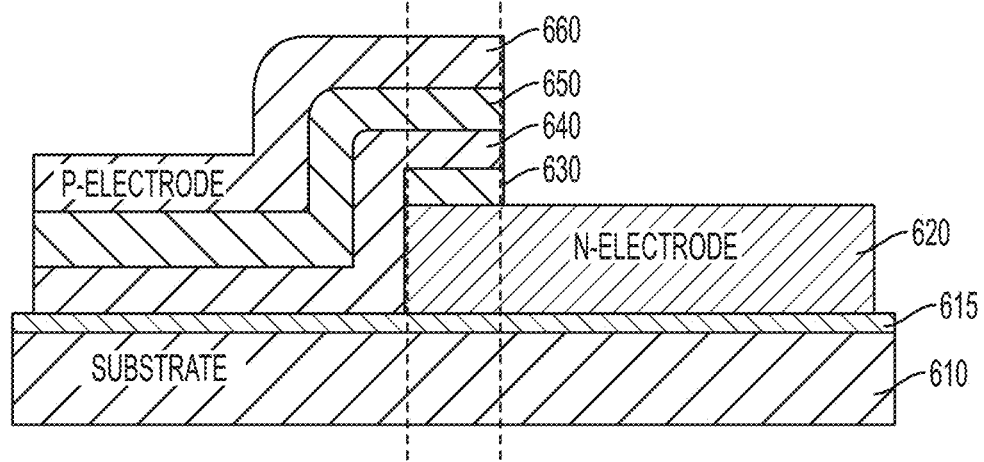

In many embodiments, the sensor 131 is a photodiode, e.g., a pn junction diode or p-i-n diode and the trigger signal is a photocurrent generated by the photodiode in response to visible light or other electromagnetic radiation. FIG. 6A is a cross sectional view and FIG. 6B is a top view of a p-i-n photodiode sensor 600 that may be used as the sensor 131 of the self destructing device 101, 102, 103 shown in FIGS. 1A through 1D in accordance with some embodiments.

The photodiode 600 comprises a first electrode layer 620 disposed over the stressed substrate 610. The first electrode layer 620 extends over the substrate 610 to form a first lead 133 of the photodiode 600. A first doped layer 630, e.g., an n-doped amorphous silicon layer is disposed over the first electrode layer 620. An intrinsic layer 640, e.g., an undoped amorphous silicon layer, is disposed between the first doped layer 630 and an oppositely doped second doped layer 650, e.g., a p-doped amorphous silicon layer. The first doped layer 630, intrinsic layer 640, and second doped layer 650 form the active region 670 of the p-i-n diode 600. A second electrode layer 660 is disposed over the second doped layer 650.

The second electrode layer 660 substantially transmits the stimulus light that turns on the photodiode 600. For example, the second electrode layer 660 may have an optical transmittance greater than 50% at wavelengths of the stimulus light. Suitable materials for the second electrode layer 660 include conductive oxides such as indium tin oxide (ITO), conductive polymers, metal grids, carbon nanotubes (CNT), graphene, wire meshes, thin metal films and/or other conductors that have the requisite optical transmittance. The device 600 may include an optical filter that narrows the band of wavelengths of light that reach the active region. For example, in some embodiments the second electrode layer, e.g., ITO layer, having a suitable thickness provides an optical filter that substantially attenuates wavelengths of light that are outside a wavelength band of the desired trigger stimulus and substantially passes wavelengths of light that are within the wavelength band of the desired trigger stimulus.

The second electrode layer 660, second doped layer 650, and intrinsic layer 640 extend over the substrate 610 and form a second lead 134 of the photodiode 600. In some embodiments, the n-doped layer comprises n-doped amorphous silicon (a-Si), the p-doped layer comprises p-doped a-Si and/or the intrinsic layer comprises intrinsic a-Si. The example of FIG. 6 illustrates a p-i-n diode, however, it will be appreciated that in some embodiments a photodiode may be formed by a pn junction without the intrinsic layer.

In some embodiments the intrinsic layer 640 of the p-i-n photodetector is a 600 nm-thick intrinsic a-Si deposited by plasma-enhanced chemical vapor deposition (PECVD). The n-layer 630 is a 120 nm-thick phosphorous-doped a-Si deposited by PECVD, and the p-layer 650 is a 20 nm-thick boron-doped a-Si deposited by PECVD. This top-side p-layer 650 is designed to be very thin in order to minimize optical absorption of the light being detected. The n-electrode 620 is a 200 nm-thick MoCr alloy deposited by sputtering, and the p-electrode 660 is a 55 nm-thick indium-tin-oxide (ITO) designed with an optical thickness optimal for transmitting the wavelength of light being detected.

Turning again to FIGS. 1A and 6, in some embodiments, the first 133 and second 132 leads electrically connect the active region of the photodiode 600 to the switch 132, power supply 140 and/or heater 120 wherein both the sensor 131, 600 and the switch 132 are disposed on the surface of the stressed substrate 110.

In some embodiments, the first 133 and second 132 leads electrically connect the active region of the photodiode 600 to a periphery of the device as depicted in FIG. 1B. For example, the leads 133, 134 may be configured to be connected to external wires 136 that communicate with one or more externally located electronic devices, e.g., the power source 140 and switch 132, which are not disposed on the substrate 110. In some embodiments, the first electrode layer 620 (first lead 133) and the heater 120 are made of the same materials.

An adhesion promoting surface 615, such as a barrier layer, may optionally be disposed between the substrate 610 and the first electrode layer 620 and or intrinsic layer 640 of the photodiode 600 and/or the heater. In one embodiment, the barrier layer comprises a 300 nm-thick PECVD deposited SiO2 barrier layer that enhances film adhesion to the ion-rich surface of the stress-engineered substrate. The intrinsic layer 640 (intrinsic a-Si) shown in FIG. 6A may not stick well to the stress-engineered substrate 610, and in that scenario the film stack would crack if the barrier layer 615 is not deposited on the stressed substrate before the intrinsic layer is deposited. Without the barrier layer 615, the ion exchanged stress engineered glass substrate may cause bubbling at the interface between the glass 610 and the photodetector layers 620, 640. Suitable materials for the barrier layer 615 include one or more of silicon dioxide (SiO2), silicon nitride (SiN), and silicon oxynitride (SiON). The barrier layer 615 may have a thickness greater than 300 nm, greater than 500 nm or between 200 and 700 nm, for example.

Figure 7A:
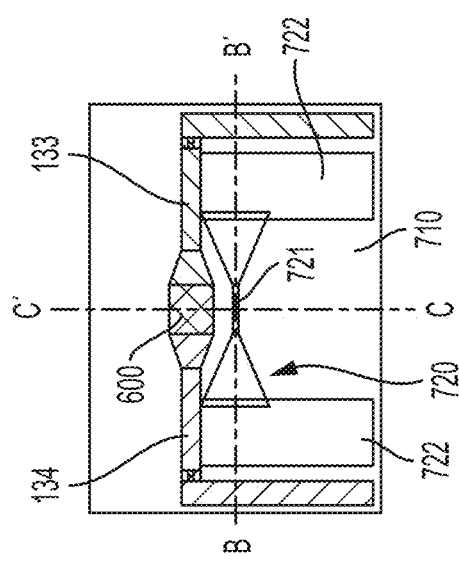
FIG. 7A shows a top view of a heater and photodiode disposed on stressed substrate in accordance with some embodiments.
Figure 7B:
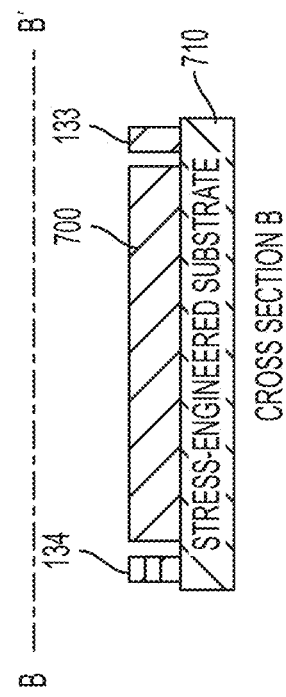
FIG. 7B shows a cross section taken through line B-B' of the heater, photodiode, and photodiode leads in accordance with some embodiments.

The heater 120 shown in FIGS. 1A and 1B may comprise a fuse portion configured to break at a predetermined temperature. FIG. 7A shows a top view of a heater 720 and photodiode 600 disposed on stressed substrate 710 in accordance with some embodiments. FIG. 7B shows a cross section taken through line B-B' of the heater 720, photodiode 600, and photodiode leads 133, 134.

The heater 720 includes a fuse portion 721 and heater leads 722 which are coupled to the ends of the fuse portion 721. The fuse portion 721 is a resistive film that operates as a fuse. The fuse portion 721 is designed to break (fuse) when heated to a predetermined temperature which occurs after the heater 720 has been connected to the power source for a predetermined period of time.

The thin film heater 720 can be fabricated out of a variety of materials. Possible materials include MoCr, Cu, and Mg. Once the heater 720 is activated, the fuse portion 721 increases in temperature until the heater material breaks (fuses). The substrate 710 then breaks apart during the cool-down cycle after the heater fuses. The film thickness of the heater 720 must be thick enough for the heater 720 to withstand the delivered electrical power for a sufficient period of time before fusing. If the heater fuses prematurely, the temperature will not rise adequately to trigger the self-destruct process. Hence, consideration should be given to the choice of heater material, impedance value, and film thickness.

The lateral cross sectional area of the fuse portion 721 taken along line C-C', the length of the fuse portion 721 along line B-B' and/or the material used for the fuse portion contribute to the resistance of the fuse portion 721. In some embodiments, one or more of the lateral cross sectional area, the length, and/or material of the fuse portion 721 are selected so that a desired, e.g., maximum, power is delivered to the fuse portion 721 by the power source. For example, the maximum power may be delivered to the fuse portion 721 when the impedance of the fuse portion 721 is substantially equal to the internal resistance of the power source. Impedance matching ensures efficient transfer of electrical power to the heater 720 when the trigger circuitry switch is activated.

Figure 8:
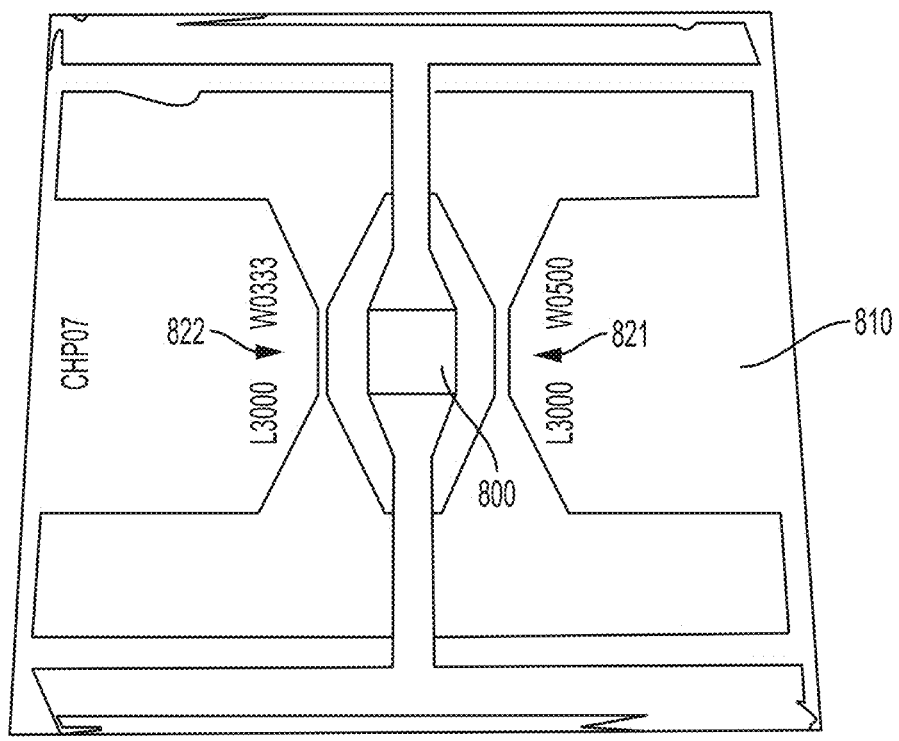
FIG. 8 is a photograph of a test structure that includes an integrated photodiode 800 and two test heaters which have different lateral cross sectional areas disposed on a stressed substrate in accordance with some embodiments.

FIG. 8 is a photograph of a test structure that includes an integrated photodiode 800 and two test heaters 821, 822 which have different lateral cross sectional areas disposed on a stressed substrate 810. In various embodiments, the heater comprises Mg, MoCr, or Cu. In some embodiments, the heater is a 2.8 µm-thick Mg film patterned into a 3 mm long×500 µm wide strip. In implementations utilizing MoCr as the heater material, the heater can be fabricated at the same time as the n-contact electrode of the photodiode, saving one masking and one deposition step. In implementations utilizing Cu heaters, a film thickness of about 1.7 µm produces very similar impedance and fusing characteristics as Mg heaters.

In some embodiments, the desired trigger signal is light from a low power conventional hand-held laser pointer typically used for making presentations. Typical wavelengths are either 532 nm (green) or 650 nm (red). The self-destruct sequence is activated by aiming the laser pointer on the photodetector 600 from a distant location. The photodetector 600 may be designed to have a large dynamic response, so it causes the electronic switch to trigger reliably when the self-destruct light trigger stimulus is detected, but not when exposed to normal ambient light. This performance feature is achieved by choosing an appropriate combination of layer thicknesses and active region area.

The area of the active region has to be large enough so it can be easily seen and targeted with a laser pointer from a distance of, for example, up to 15 feet. However, if the area is too big, the photocurrent caused by ambient light could be so large that it triggers the self-destruct process. In some embodiments, the photodetector can have active area size of 3 mm×3 mm in combination with the i and p a-Si layer thickness choices tabulated in Table 1 which provides an exemplary layer structure of an integrated thin film photodetectors sensor at the active region disposed on an ion exchanged glass stressed substrate.

TABLE 1

| Thickness | Layer | Material/process |
| --- | --- | --- |
| 550 Å | p electrode | ITO tuned for green light,/sputtered |
| 200 Å | p doped a-Si | Boron doped/PECVD |
| 6000 Å | intrinsic a-Si | /PECVD |
| 1200 Å | n doped a-Si | Phosphorus doped/PECVD |
| 2000 Å | n electrode | MoCr/sputtered |
| 3000 Å | barrier | Oxide/PECVD |

Ion exchanged glass stressed substrate

Figure 9:
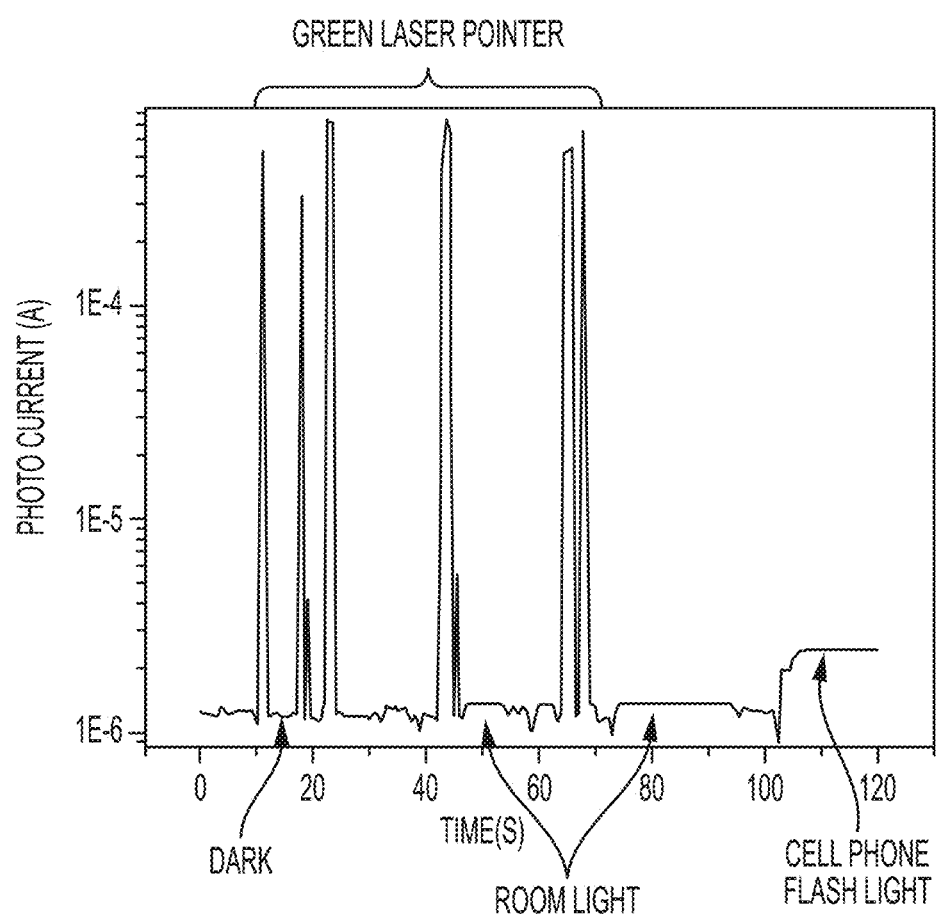
FIG. 9 shows the photocurrent response when the photodetector is in the dark, exposed to ambient light in a bright fluorescent-lit room, illuminated with a bright cell phone LED flashlight at close proximity, and when illuminated with a typical 5 mW green laser pointer.

FIG. 9 shows the photocurrent response when the 3 mm×3 mm photodetector is in the dark, exposed to ambient light in a bright fluorescent-lit room, illuminated with a bright cell phone LED flashlight at close proximity, and when illuminated with a typical 5 mW green laser pointer. The contrast in photocurrent response between ambient light and trigger light exceeds 2 orders of magnitude, so the device architecture disclosed herein allows a wide design margin for choosing a threshold photocurrent that determines when the self-destruct switch is triggered. For example, in some embodiments, the self destruct switch can be designed to trigger to connect the power source to the heater when the photocurrent is about twice the expected maximum photocurrent produced by the ambient environment of the sensor.

Figure 10:
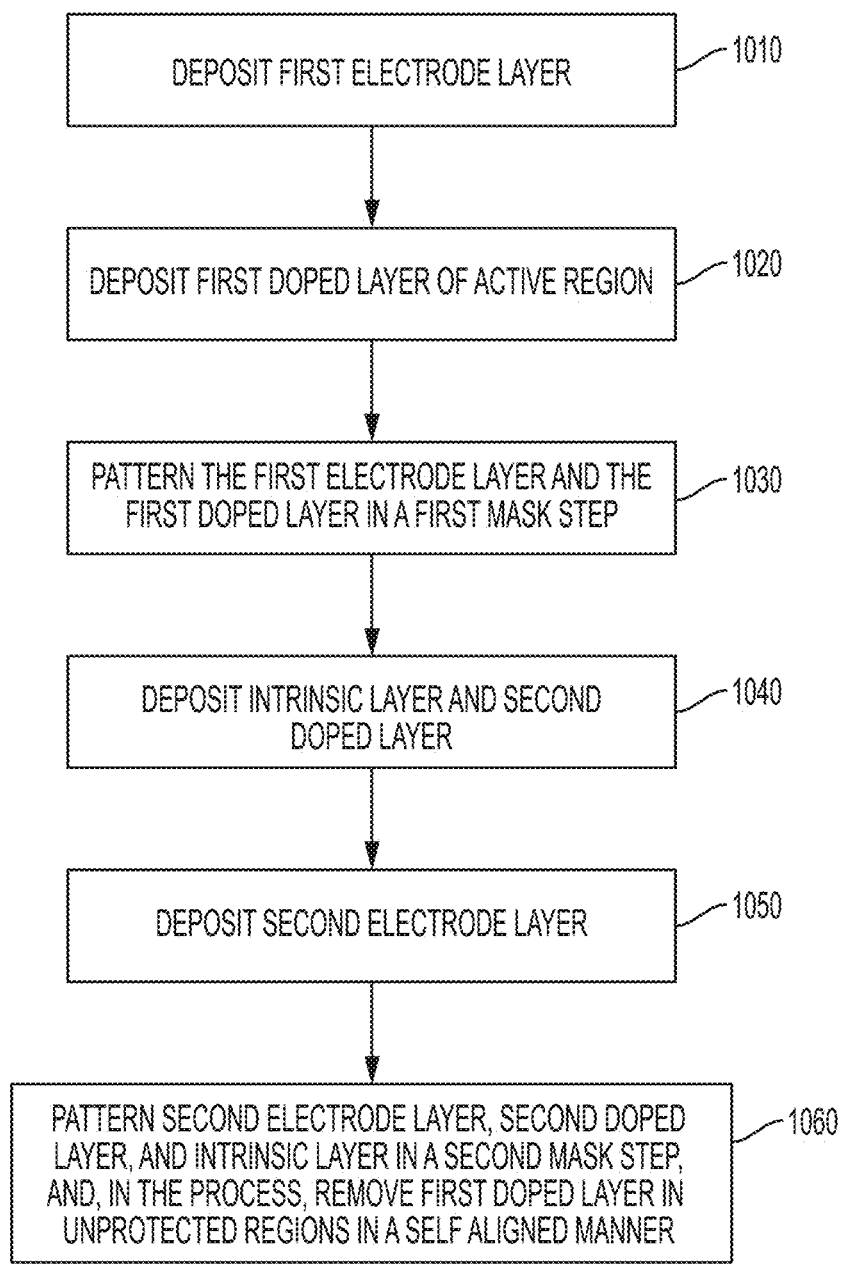
FIG. 10 is a flow diagram that illustrates a process of making a photodetector in accordance with some embodiments.

In some embodiments, the photodetector is fabricated so the electrodes/leads are formed together with the active layers in a self aligned fashion, allowing the complete device, including electrical routing leads that connect the active region to the periphery of the substrate, to be made with not more than two masking layers. FIG. 10 is a flow diagram that illustrates a process of making the photodetector in accordance with some embodiments. FIGS. 11A, 11B, and 6B diagrammatically depict top views that illustrate the process of making the photodetector.

The photodetector may be formed by first depositing an optional barrier layer on a stress-engineered substrate. A first electrode layer is then deposited 1010 on the barrier layer. In some embodiments, the first electrode layer comprises a MoCr alloy that is sputtered on the barrier layer. A first doped semiconductor layer is deposited 1020 on the first electrode layer. The first doped layer may be an n-doped a-Si layer deposited by PECVD, for example. The first doped semiconductor layer and the underlying first electrode layer are then patterned 1030 to form the first electrode region, e.g., by photolithographic patterning of the first electrode layer/first doped layer stack through a first masking step followed by CF4 plasma etching of the first doped layer and chemical wet etching of the first electrode layer.

FIG. 11A shows a top view of the first electrode region 1101 comprising the first electrode/first doped semiconductor layer stack after the first patterning step. An intrinsic layer, e.g., intrinsic a-Si and a second, oppositely doped layer, e.g., p-doped a-Si, are deposited 1040 above the patterned first electrode region, e.g. by PECVD. The second electrode layer is deposited 1050 above the second doped layer. For example, the second electrode layer may comprise ITO deposited by sputtering. The second electrode layer is patterned 1060, e.g., by photolithographic exposure through a second mask followed by chemical etching with HCl acid according to the pattern 1102 in FIG. 11B. The intrinsic and second doped layers are etched, e.g., with CF4 plasma, also using the second mask. This second patterning step not only patterns the second doped and intrinsic layers in the active region, but also selectively removes the remaining portions of the first doped layer above the first electrode layer in the first electrode region formed in the previous patterning step. The end result is the device 600 shown in FIGS. 6A and 6B, where the electrodes can be formed together with the active region in a self-aligned manner in only two masking steps. In some embodiments the first electrode layer and the heater can be formed simultaneously from the same materials.

FIG. 12A provides a circuit schematic for a self-destructing device that includes a photodetector sensor 1231 according to embodiments disclosed herein. In some embodiments, the trigger circuitry 1230 is configured to activate the switch 1232 at a photocurrent from the sensor 1231 of about 60 µA, which is midway between the ambient light and laser-illuminated values indicated in the graph of FIG. 9. This choice allows the photodetector 1231 to be exposed to a wide range of ambient light conditions without triggering the self destruct sequence, while ensuring reliable triggering when illuminated with laser pointers having a wide range of laser output power levels.

When triggered, the photocurrent from the photodetector 1231 closes the electronic switch 1232, coupling the first terminal 1221 of the thin film heater 1220 integrated on the stress engineered substrate to the power supply 1240. When the first terminal 1221 is coupled to the power supply 1240 through the switch 1232 electrical current flows in a circuit from the positive terminal of the power source 1240, through terminal 1222, through the heater 1220, through terminal 1221, through the switch 1232, and through the negative terminal of the power source 1240. The electrical power delivered to the heater 1220 causes a rapid increase in temperature of the heater, which damages the substrate at that location. The damage causes the substrate to release built-in mechanical stress and to self-destruct into small pieces. In the embodiment illustrated in FIG. 12A, the p-i-n photodetector 1231 and the heater 1220 may be integrated on the self-destructing substrate, and the electronic switch 1232 is a silicon-controlled rectifier (SCR) located externally from the substrate. For example, the SCR may be an off-the-shelf thyristor with part number ST TS110-7 that has a trigger current of close to 60 µA. In alternative implementations, the SCR switch can be integrated on the self-destructing substrate, as indicated by FIG. 1B. Thyristors are suitable switches in some embodiments because the connection latches and remains switched on once triggered, even when the trigger stimulus is subsequently removed. Once triggered, the sensor can become damaged or non-functional without affecting the self-destruction sequence.

Figure 12B:
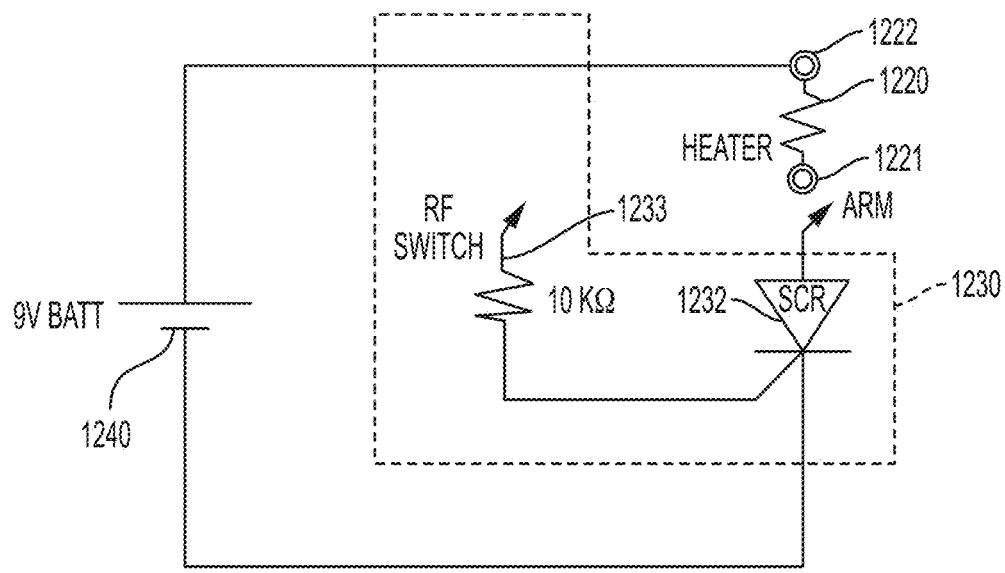
FIG. 12B provides another circuit schematic for a self destructing device according to embodiments disclosed herein.

FIG. 12B provides a circuit schematic for a self-destructing device that includes a sensor comprising an RF activated switch 1233 according to embodiments disclosed herein. When triggered, the current through the RF activated switch 1233 closes the electronic switch 1232, coupling the first terminal 1221 of the thin film heater 1220 integrated on the stress engineered substrate to the power supply 1240. When the first terminal 1221 is coupled to the power supply 1240 through the switch 1232 electrical current flows in a circuit from the positive terminal of the power source 1240, through terminal 1222, through the heater 1220, through terminal 1221, through the switch 1232, and through the negative terminal of the power source 1240. The electrical power delivered to the heater 1220 causes a rapid increase in temperature of the heater, which damages the substrate at that location. The damage causes the substrate to release built-in mechanical stress and to self-destruct into small pieces. In the embodiment illustrated in FIG. 12B, the RF activated switch 1233 and the electronic switch 1232 may be located externally from the substrate as indicated in FIG. 1C. In alternative implementations, the RF activated switch 1233 and/or the electronic SCR switch can be integrated on the self-destructing substrate, as indicated by FIGS. 1A and/or 1B.

Figure 13:
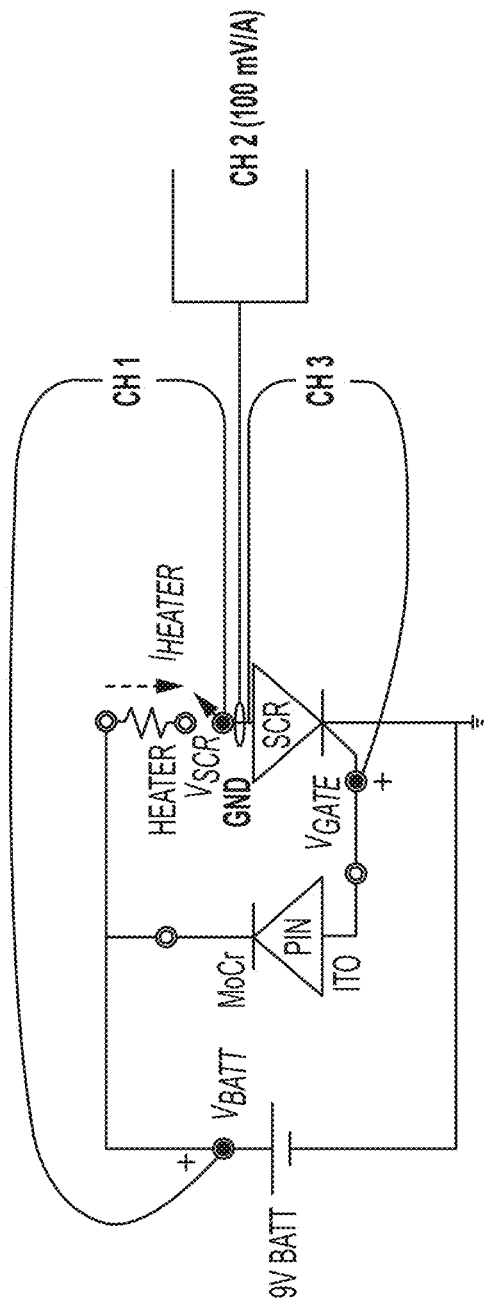
FIG. 13 shows an illustration of electrical test probes placed on various locations of the circuit of FIG. 12 to monitor the self-destruct process.
Figure 14:
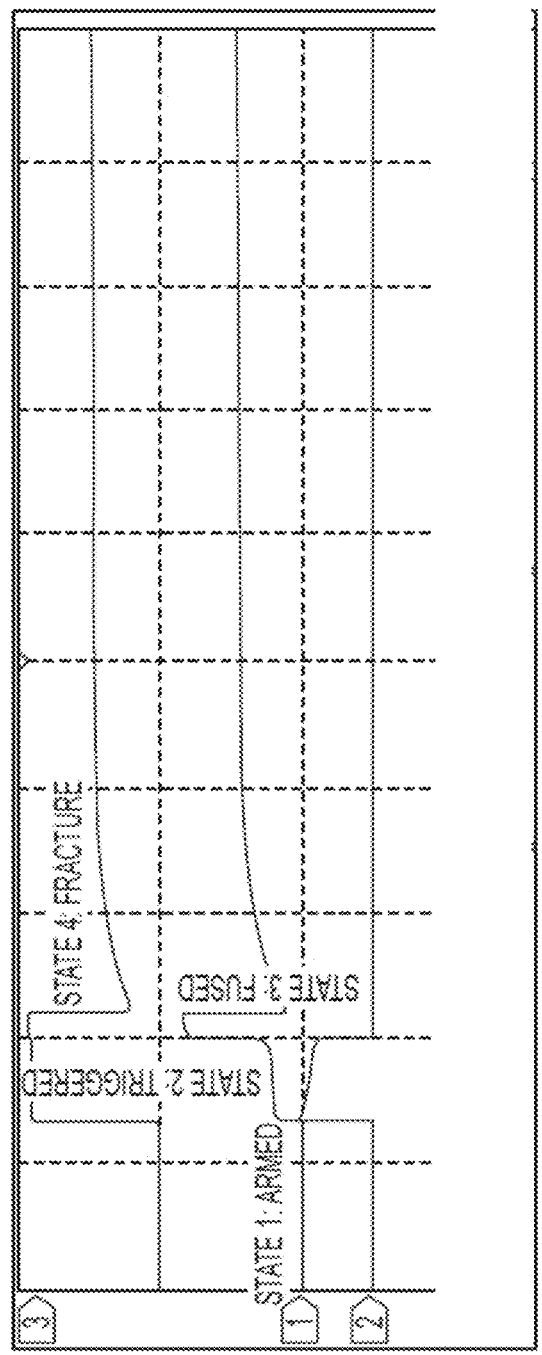
FIG. 14 shows the corresponding oscilloscope signals (CH 1, CH 2, CH 3) at various times during the self-destruct process.

FIGS. 13 and 14 illustrate in detail the operation of the trigger circuitry in accordance with some embodiments. FIG. 13 shows an illustration of electrical test probes placed on various locations of the circuit to monitor the self-destruct process. FIG. 14 shows the corresponding oscilloscope signals (CH 1, CH 2, CH 3) at various times during the self-destruct process. Channel 1 of the oscilloscope (CH 1) measures the voltage between the positive terminal of the power source ($V_{batt}$) and the connection between the heater and switch ($V_{SCR}$). Channel 2 of the oscilloscope (CH 2) represents the measured current through the heater and switch as a voltage. Channel 3 of the oscilloscope (CH 3) measures the voltage across the SCR between $V_{SCR}$ and $V_{gate}$. The changes in voltage in the signal traces indicate the progression of the self-destruct process, from the armed state (circuit ready), to the triggered state (electronic switch closed), to the fused state (heater burn-out), and to substrate fracture (substrate self-destructs). The monitoring technique shown in FIGS. 13 and 14 is useful for developing and selecting the choices of thin film materials and processing parameters, and for characterizing their overall effect on the self-destruct sequence. Further information regarding self-limiting electrical triggering for initiating fracture of frangible glass is discussed in commonly owned and concurrently filed U.S. patent application Ser. No. 15/220,164, filed Jul. 26, 2016, which is incorporated herein by reference.

Figure 15B:
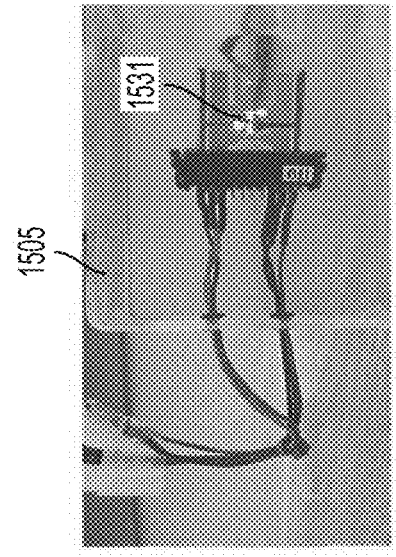
FIGS. 15A through 15D are a sequence of time lapse photographs that show optically triggered self destruction of a substrate.
Figure 15D:
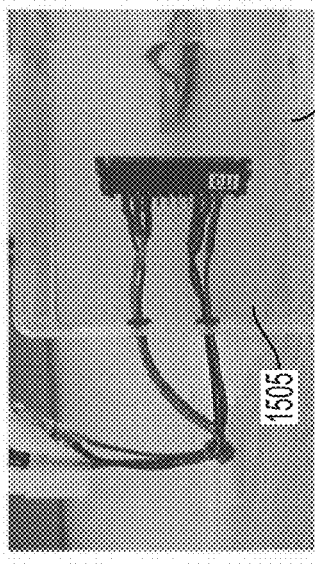
Figure 15A:
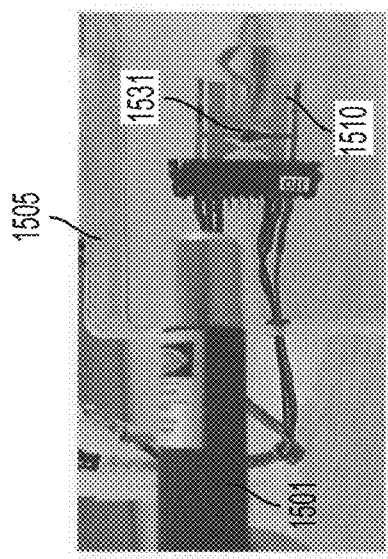
Figure 15C:
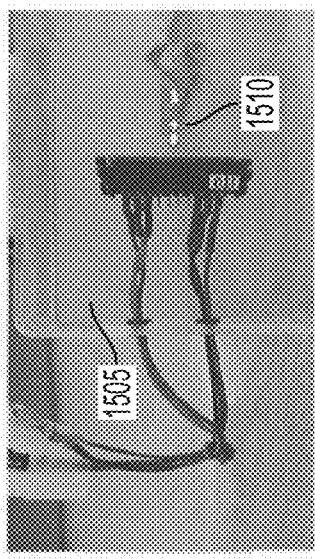

FIGS. 15A through 15D show a series of photographs from when a photodetector 1521 is illuminated with a laser pointer to after the substrate 1510 self-destructs. FIG. 15A shows the substrate 1510 in a protective enclosure 1505 and a laser pointer 1501 in the foreground. FIG. 15B shows the photodetector 1531 being illuminated with light from the laser pointer. FIG. 15C shows the substrate 1510 undergoing self-destruction, FIG. 15D shows the shattered substrate pieces 1502 at the bottom of the enclosure 1505.

FIGS. 16A through 16D show a series of photographs from before an RF activated switch (not shown) is activated by a keyfob RF transmitter 1601 to after the substrate 1610 self-destructs. FIG. 16A shows the substrate 1610 in a protective enclosure 1605 and the RF transmitter 1601 in the foreground. FIG. 16B shows the RF transmitter 1601 being activated and a bright spot where the heater 1620 is in the process of fusing. FIG. 16C shows the heater 1620 after it has fused. FIG. 16D is a photograph taken after self-destruction of the substrate 1610.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Various modifications and alterations of the embodiments discussed above will be apparent to those skilled in the art, and it should be understood that this disclosure is not limited to the illustrative embodiments set forth herein. The reader should assume that features of one disclosed embodiment can also be applied to all other disclosed embodiments unless otherwise indicated. It should also be understood that all U.S. patents, patent applications, patent application publications, and other patent and non-patent documents referred to herein are incorporated by reference, to the extent they do not contradict the foregoing disclosure.

The invention claimed is:

1. A method of forming a photodiode comprising:
depositing a first electrode layer over a substrate;
depositing a first doped layer of an active region over the first electrode layer;
depositing an intrinsic layer over the first doped layer;
depositing a second doped layer of the active region over the intrinsic layer;
depositing a second electrode layer over the second doped layer; and
patterning the first electrode layer, the first doped layer, the intrinsic layer, the second doped layer, and the second electrode layer to form the photodiode in not more than two mask steps, wherein the patterning comprises:
patterning the first electrode layer and the first doped layer in a first patterning step using a first mask;
patterning the second electrode layer, the second doped layer, and the intrinsic layer in a second patterning step using a second mask; and
during the second patterning step removing the first doped layer in unprotected regions in a self-aligned manner.

2. The method of claim 1, further comprising forming an adhesion promoting surface on the substrate, wherein depositing the first electrode layer comprises depositing the first electrode layer on the adhesion promoting surface.

3. The method of claim 2, wherein forming the adhesion promoting surface comprises depositing a layer of silicon oxide, silicon nitride, or silicon oxynitride by plasma-enhanced chemical vapor deposition.

4. The method of claim 1, wherein the second electrode layer is configured to transmit a trigger stimulus to the active region of the photodiode.

5. The method of claim 1, wherein depositing the second electrode layer comprises forming an optical filter that substantially attenuates wavelengths of light that are outside a wavelength band of a trigger stimulus and substantially passes wavelengths of light that are within the wavelength band of the trigger stimulus.

6. The method of claim 1, wherein:
the substrate comprises a stressed substrate; and
the stressed substrate comprising at least one tensile stress layer having a residual tensile stress and at least one compressive stress layer having a residual compressive stress and being mechanically coupled to the at least one tensile stress layer such that the at least one tensile stress layer and the at least one compressive stress layer are self-equilibrating.

7. The method of claim 1, wherein:
the substrate comprises a stressed substrate; and
the stressed substrate comprises chemically tempered glass.

8. A method of forming a photodiode comprising:
depositing a first electrode layer over a stressed substrate;
depositing a first doped layer of an active region over the first electrode layer;
depositing an intrinsic layer over the first doped layer;
depositing a second doped layer of the active region over the intrinsic layer;
depositing a second electrode layer over the second doped layer; and
patterning the first electrode layer, the first doped layer, the intrinsic layer, the second doped layer, and the second electrode layer to form the photodiode, wherein the patterning comprises:
patterning the first electrode layer and the first doped layer in a first patterning step using a first mask;
patterning the second electrode layer, the second doped layer, and the intrinsic layer in a second patterning step using a second mask; and
during the second patterning step removing the first doped layer in unprotected regions in a self-aligned manner.

9. The method of claim 8, wherein the patterning comprises patterning the first electrode layer, the first doped layer, the intrinsic layer, the second doped layer, and the second electrode layer to form the photodiode in not more than two mask steps.

10. The method of claim 8, further comprising forming an adhesion promoting surface on the stressed substrate, wherein depositing the first electrode layer comprises depositing the first electrode layer on the adhesion promoting surface.

11. The method of claim 10, wherein forming the adhesion promoting surface comprises depositing a layer of silicon oxide, silicon nitride, or silicon oxynitride by plasma-enhanced chemical vapor deposition.

12. The method of claim 8, wherein the second electrode layer is configured to transmit a trigger stimulus to the active region of the photodiode.

13. The method of claim 8, wherein depositing the second electrode layer comprises forming an optical filter that substantially attenuates wavelengths of light that are outside a wavelength band of a trigger stimulus and substantially passes wavelengths of light that are within the wavelength band of the trigger stimulus.

14. The method of claim 8, wherein the stressed substrate includes at least one tensile stress layer having a residual tensile stress and at least one compressive stress layer having a residual compressive stress and being mechanically coupled to the at least one tensile stress layer such that the at least one tensile stress layer and the at least one compressive stress layer are self-equilibrating.

15. The method of claim 8, wherein the stressed substrate comprises chemically tempered glass.

16. A method of forming a photodiode comprising:
   depositing a first electrode layer over a stressed substrate;
   depositing a first doped layer of an active region over the first electrode layer;
   depositing a second doped layer of the active region over the first doped layer;
   depositing a second electrode layer over the second doped layer; and
   patterning the first electrode layer, the first doped layer, the second doped layer, and the second electrode layer to form the photodiode, wherein the patterning comprises:
      patterning the first electrode layer and the first doped layer in a first patterning step using a first mask;
      patterning the second electrode layer and the second doped layer in a second patterning step using a second mask; and
      during the second patterning step removing the first doped layer in unprotected regions in a self-aligned manner.

17. The method of claim 16, wherein the patterning comprises patterning the first electrode layer, the first doped layer, the second doped layer, and the second electrode layer to form the photodiode in not more than two mask steps.

18. The method of claim 16, further comprising forming an adhesion promoting surface on the stressed substrate, wherein depositing the first electrode layer comprises depositing the first electrode layer on the adhesion promoting surface.

19. The method of claim 18, wherein forming the adhesion promoting surface comprises depositing a layer of silicon oxide, silicon nitride, or silicon oxynitride by plasma-enhanced chemical vapor deposition.

20. The method of claim 16, wherein the second electrode layer is configured to transmit a trigger stimulus to the active region of the photodiode.

21. The method of claim 16, wherein depositing the second electrode layer comprises forming an optical filter that substantially attenuates wavelengths of light that are outside a wavelength band of a trigger stimulus and substantially passes wavelengths of light that are within the wavelength band of the trigger stimulus.

22. The method of claim 16, wherein the stressed substrate includes at least one tensile stress layer having a residual tensile stress and at least one compressive stress layer having a residual compressive stress and being mechanically coupled to the at least one tensile stress layer such that the at least one tensile stress layer and the at least one compressive stress layer are self-equilibrating.

23. The method of claim 16, wherein the stressed substrate comprises chemically tempered glass.

* * * * *